USOO6130122A

United States Patent [19]
Johnson

[11] Patent Number: 6,130,122
[45] Date of Patent: Oct. 10, 2000

[54] METHOD FOR FORMING A BICMOS INTEGRATED CIRCUIT WITH NWELL COMPENSATION IMPLANT AND METHOD

[75] Inventor: Frank Scott Johnson, Richardson, Tex.

[73] Assignee: Texas Instruments Incorporated, Dallas, Tex.

[21] Appl. No.: 09/115,857

[22] Filed: Jul. 15, 1998

Related U.S. Application Data

[60] Provisional application No. 60/053,275, Jul. 21, 1997.

[51] Int. Cl.[7] .................. H01L 21/8238; H01L 21/8249; H01L 21/331
[52] U.S. Cl. ......................... 438/202; 438/234; 438/350
[58] Field of Search .................... 438/202, 197, 438/207, 234, 204, 205, 236, 322, 326, 327, 340, 350, 919

[56] References Cited

U.S. PATENT DOCUMENTS 4,717,686   1/1988  Jacobs et al. ........................ 437/56
5,089,429   2/1992  Hsu .................................... 437/162
5,605,849   2/1997  Chen et al. ........................... 437/31
5,726,069   3/1998  Chen et al. ........................... 437/31

FOREIGN PATENT DOCUMENTS 63-240058  10/1988  Japan ............................. H01L 27/06
2 255 226  10/1992  United Kingdom ............ H01L 27/06

Primary Examiner—Matthew Smith
Assistant Examiner—Lex A. Malsawma
Attorney, Agent, or Firm—Jacqueline J. Garner; W. James Brady, III; Frederick J. Telecky, Jr.

[57]  ABSTRACT

A BiCMOS integrated circuit with Nwell compensation implants and a method for fabricating the same is disclosed. In accordance with the method of fabricating a BiCMOS integrated circuit, a plurality of Nwell regions are created in a semiconductor substrate. At least some of the Nwell regions comprise lightly doped collector regions of bipolar transistors while others of the Nwell regions comprise Nwell regions of MOS transistors. A plurality of isolation regions are created to electrically isolate at least some of the Nwell regions. A p-type dopant is implanted in at least some of the lightly doped collector regions of the bipolar transistors.

12 Claims, 1 Drawing Sheet

METHOD FOR FORMING A BICMOS INTEGRATED CIRCUIT WITH NWELL COMPENSATION IMPLANT AND METHOD

This application claims priority under 35 USC § 119 (e) (1) of provisional application Ser. No. 60/053,275, filed Jul. 21, 1997.

TECHNICAL FIELD OF THE INVENTION

This invention relates generally to semiconductor processing and, more particularly, to a BiCMOS integrated circuit with an Nwell compensation implant and method.

BACKGROUND OF THE INVENTION

BiCMOS integrated circuits contain both bipolar and MOS transistors. In a typically used BiCMOS fabrication process, the Nwell doping profile is determined by constraints on both the PMOS and NPN devices. PMOS device requirements that may affect the doping profile of the Nwell include source/drain punch through voltage, latch up immunity, moat-moat punch through isolation threshold voltage, and Nwell-substrate breakdown voltage. Often, in satisfying these requirements for PMOS devices, the related performance of NPN bipolar devices is sacrificed. Specifically, NPN transistors may suffer from degraded performance in terms of base-collector breakdown voltage, base-collector junction capacitance, and/or collector current density.

SUMMARY OF THE INVENTION

The invention employs Nwell compensation implants to improve the performance of NPN transistors in BiCMOS integrated circuits. One aspect of the invention is a method of fabricating a BiCMOS circuit. A plurality of Nwell regions are created in a semiconductor substrate wherein at least some of the Nwell regions comprise lightly doped collector regions of bipolar transistors and at least some of the Nwell regions comprise Nwell regions of MOS transistors. A plurality of isolation regions are created to electrically isolate at least some of the Nwell regions. A p-type dopant is implanted in at least some of the lightly doped collector regions of the bipolar transistors.

The invention has several important technical advantages. Because the invention allows better control over the doping of the lightly doped collector region, NPN devices in BiCMOS integrated circuits may be fabricated with more desirable performance characteristics, while optimizing performance of PMOS devices. Specifically, the invention allows control of base-collector junction capacitance and/or Early voltage. Because base-collector junction capacitance can be controlled, bipolar transistors in BiCMOS integrated circuits can be fabricated to have higher cutoff frequencies and lower collector resistance as compared to existing BiCMOS integrated circuits. The invention achieves these advantages while adding few additional process steps.

BRIEF DESCRIPTION OF THE DRAWINGS

For a more complete understanding of the present invention and the advantages thereof, reference is now made to the following descriptions, taken in conjunction with the accompanying drawings, in which.

DETAILED DESCRIPTION OF THE INVENTION

Figure 1:
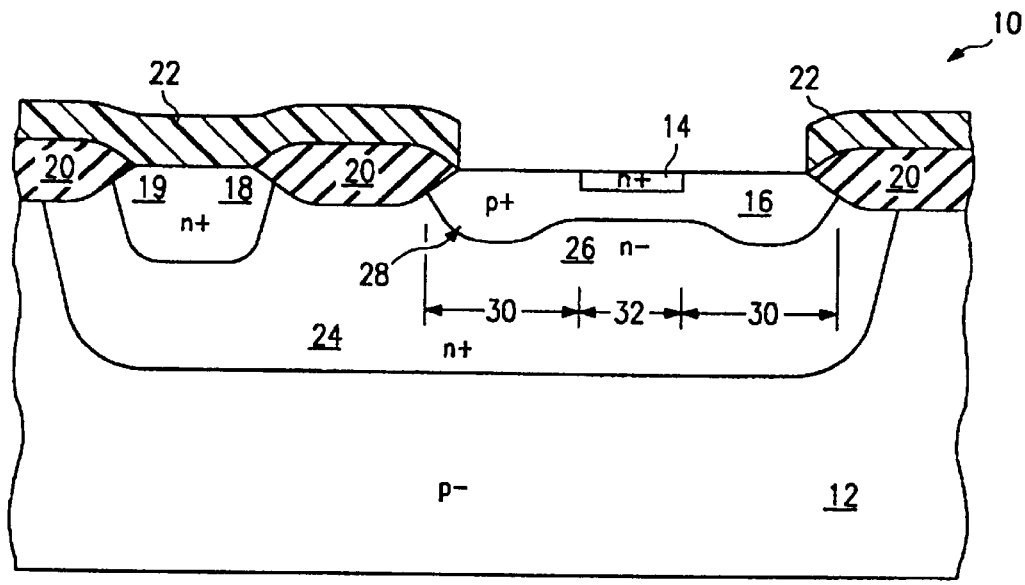
FIG. 1 illustrates a cross-section of a partially completed BiCMOS integrated circuit fabricated in accordance with the teachings of the invention.
Figure 2:
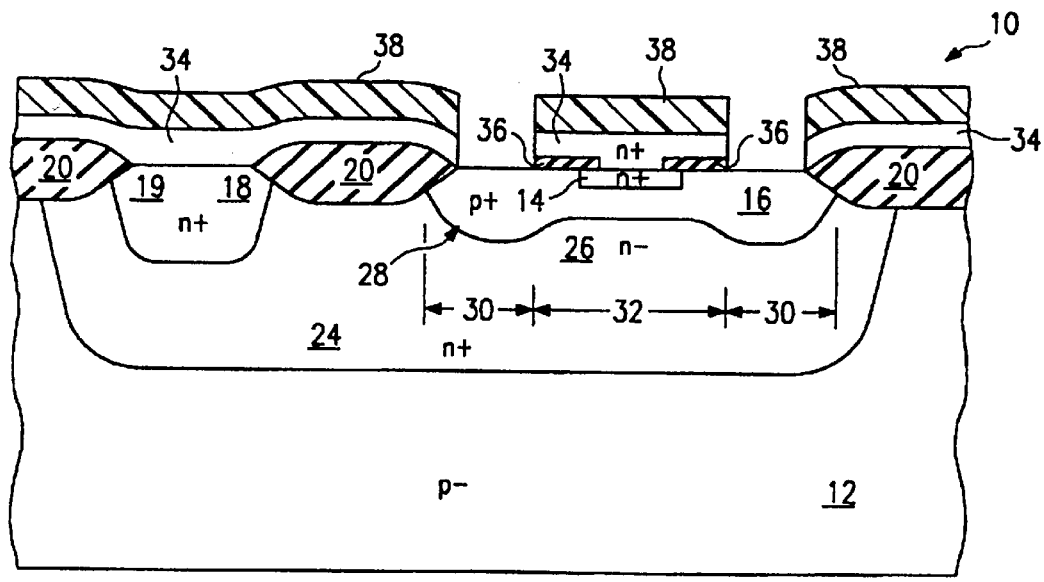
FIG. 2 illustrates a cross-section of a partially completed BiCMOS integrated circuit fabricated using the teachings of the invention.

The preferred embodiment of the present invention and its advantages are best understood by referring to FIGS. 1 through 2 of the drawings, like numerals being used for like and corresponding parts of the various drawings.

FIG. 1 illustrates a cross-section of a portion of a partially completed BiCMOS integrated circuit. Specifically, FIG. 1 illustrates bipolar transistor 10. Bipolar transistor 10 comprises emitter 14, base 16, and collector 18. Bipolar transistor 10 is fabricated in substrate 12.

Emitter 14 has been heavily doped with an n-type dopant while base 16 has been heavily doped with a p-type dopant. Collector 18 has been doped with an n-type dopant.

However, collector 18 is doped differently in different regions. In collector contact region 19, and buried collector region 24, collector 18 is heavily doped. In lightly doped collector region 26, collector 18 has been lightly doped. During earlier steps of fabricating the integrated circuit illustrated in FIG. 1, a plurality of Nwell regions were formed in semiconductor substrate 12. At least some of these Nwell regions will form the Nwell region of a PMOS transistor. As illustrated in FIG. 1, one of these Nwell regions forms the lightly doped collector region 26 of bipolar transistor 10.

Base 16 and collector contact area 19 are separated by isolation oxide 20. Isolation oxide 20 also separates bipolar transistor 10 from adjacent devices. A layer of photoresist 22 has been patterned and etched to mask all but the emitter 14 and base 16 of bipolar transistor 10.

If it is desired that bipolar transistor 10 should have a higher Early voltage, $V_A$, then the lightly doped collector region 26 may be implanted with a p-type dopant, such as boron, to compensate for the doping profile of the lightly doped collector region 26 that was created during the formation of the Nwells. In this embodiment, both the extrinsic base area 30 and intrinsic base area 32 of the lightly doped collector region 26 are implanted with a p-type dopant. Extrinsic base area 30 of lightly doped collector region 26 comprises that area of lightly doped collector region 26 substantially disposed inwardly from the area of base 16 that is not disposed inwardly from emitter 14. The intrinsic base area 32 of lightly doped collector region 26 substantially comprises that portion of lightly doped collector region 26 disposed inwardly from both base 16 and emitter 14.

Although boron is used to implant bipolar transistor 10, other p-type dopants could be used without departing from the scope of the invention. The invention may be used to implant selected bipolar transistors 10 of a BiCMOS integrated circuit. If it is desirable that only certain of the bipolar transistors have higher Early voltage, then only those bipolar transistors 10 would be implanted. other bipolar transistors 10 and the CMOS transistors of the BiCMOS integrated circuit would be masked by photoresist layer 22 during the implantation process.

The invention may use available implantation techniques to perform the implant of the p-type dopant. In such techniques, the doping profile may be controlled by adjusting the energy of the implanted ions and controlling the number of ions implanted. The ion implantation profile is normally Gaussian in shape. Preferably, when implanting lightly doped collector region 26 in accordance with the invention, the peak of the Gaussian ion implantation profile should lie below the extrinsic base to well junction 28. The ion concentration chosen for the implant will be directly dependent upon compensating for the doping profile in lightly doped collector region 26 that was created when implanting the Nwells. Preferably, the peak ion concentration will closely match the concentration of n-type dopant in the lightly doped collector region 26 that was created during the formation of the Nwells. Depending upon the characteristics desired for bipolar transistor 10, one could also use multiple ion implants to more closely tailor the doping profile to the desired device performance.

The implantation of the p-type dopant in accordance with the invention may occur at various points in a fabrication process. For example, implantation could be performed after the gate stack pattern and etch for the MOS devices, but prior to formation of base region 16.

Alternatively, implantation of the P-type dopant could occur after formation of base region 16. The invention may thus be flexibly implemented at various points in a fabrication process.

FIG. 2 illustrates a cross-section of a portion of a partially completed BiCMOS integrated circuit constructed in accordance with the invention. In this embodiment, bipolar transistor 10 further comprises emitter polysilicon layer 34 and dielectric regions 36. A layer of photoresist 38 is deposed on top of polysilicon layer 34.

In this embodiment, a p-type dopant is implanted in the extrinsic base area 30 of lightly doped collector region 26. As was the case with the implantation discussed in connection with FIG. 1, boron or any other p-type dopant can be used for implantation. Also, as discussed above in connection with FIG. 1, the doping profile of the implant may be controlled by varying the energy of the ions and the number of ions that are implanted. Again, the peak concentration of the implantation profile will closely match the n-type dopant concentration of lightly doped collector region 26. Multiple implants may be used to construct more complicated doping profiles.

The implantation described in connection with FIG. 2 may also be used in conjunction with an implantation such as described in connection with FIG. 1. By performing multiple implants, some involving both the intrinsic and extrinsic areas of the lightly doped collector region 26 and others involving only the extrinsic region of the lightly doped collector region 26, one can more carefully control the device characteristics of bipolar transistor 10.

By performing an implant such as described in connection with FIG. 2, the intrinsic base area 32 of the lightly doped collector region 26 remains a lightly doped n-type material. Accordingly, intrinsic base area 32 will have a lower collector resistance, thus allowing higher collector current. Implantation into extrinsic base area 30 will reduce the base-to-collector junction capacitance and, in turn, increase the maximum operating frequency of bipolar transistor 10. Implanting only the extrinsic base area 30 of lightly doped collector region 26 also reduces peripheral capacitance and increases the base-collector breakdown voltage. The use of multiple implants of the extrinsic base area 30 would allow a wider portion of the lightly doped collector region 26 to be compensated, further reducing the electric field and improving breakdown voltage and collector-base junction capacitance.

Although the implantation of the present invention could occur at various points in a BiCMOS fabrication process, an example BiCMOS fabrication process will now be described. Beginning with a lightly doped p-type semiconductor substrate 12, a series of Nwells are formed in the substrate. Following Nwell formation, an isolation region is created between adjacent devices using either LOCOS isolation or some other isolation method such as shallow trench isolation. Following creation of the isolation region, the gate stack pattern and etch is performed for the MOS transistors. This etch exposes the base and collector areas of bipolar transistors such as is illustrated in FIG. 1. At this point, implantation of both the extrinsic base area 30 and intrinsic base area 32 of lightly doped collector region 26 may occur. Alternatively, implantation may occur after formation of base region 16 and/or emitter region 14. Next, after forming dielectric regions 36, poly emitter layer 34 is patterned and etched. Following formation of poly emitter 34, a layer of photoresist is patterned and etched to leave an area of base 16 exposed. At this point, implantation of extrinsic base area 30 of lightly doped collector region 26 may be performed as described above in connection with FIG. 2. Following such implantation, the MOS transistors are completed with patterning of the gates and implantation of the source and drain regions. Other BiCMOS processes may be used without departing from the scope of the invention.

With many BiCMOS processes an implant may be performed without an additional masking step. For example, for BiCMOS processes with double poly bipolar transistors that include an etch-stop layer for the base poly etch, the implant can be made self-aligned to the etch-stop between the etch-stop patterning and resist strip. For a single polysilicon processes using a polysilicon emitter etch to define the intrinsic emitter region, the implant can be performed before or just after emitter polysilicon etch. Other ways of performing a self-aligned implant to either the intrinsic or extrinsic device patterning may be used without departing from the scope of the invention.

Although the invention has been described and illustrated for an NPN transistor, the invention may also be used for PNP transistors. In the case of a PNP transistor, the structure would be similar to or identical to the structures illustrated in FIGS. 1 and 2 except that the material types would be the complement of those illustrated. The substrate 12 could be isolated with a deep lightly doped n-type region, allowing the use of a lightly doped p-type substrate. The implant of the present invention would be an n-type material such as phosphorous and/or arsenic.

Although the present invention has been described in detail, it should be understood that various changes, substitutions, and alterations can be made hereto without departing from the spirit and scope of the invention as defined by the appended claims.

What is claimed is:

1. A method of fabricating a BiCMOS circuits, comprising the steps of:

forming a plurality of Nwell regions in a semiconductor substrate;

forming a plurality of isolation regions to electrically isolate at least some of the Nwell regions;

forming MOS transistors in a first subset of said plurality of Nwell regions;

forming extrinsic and intrinsic base regions of bipolar transistors in a second subset of Nwell regions; and implanting a p-type dopant in at least some of said second subset of Nwell regions to form lightly doped collector regions in at least some of the bipolar transistors.

2. The method of claim 1, wherein the p-type dopant comprises Boron.

3. The method of claim 1, wherein said implanting a p-type dopant step comprises implanting said p-type dopant into at least some of the extrinsic and intrinsic base regions.

4. The method of claim 1, wherein said implanting a p-type dopant step comprises implanting said p-type dopant into at least some of the extrinsic base regions only.

5. The method of claim 1, wherein said step of forming MOS transistors forms a gate stack of the MOS transistors prior to the step of implanting the p-type dopant.

6. The method of claim 1, wherein said extrinsic and intrinsic base regions are formed prior to the step of implanting the p-type dopant.

7. The method of claim 1, further comprising the step of:
   forming emitters of the bipolar transistors prior to said step of implanting the p-type dopant.

8. The method of claim 1, wherein the p-type dopant is implanted according to a first doping profile determined by the number of ions implanted and the energy used to implant them, the first doping profile comprising an approximately Gaussian distribution having a peak at a first depth, wherein the first depth is greater than a depth of the extrinsic base regions.

9. The method of claim 1, wherein the implanting step further comprises:
   implanting a p-type dopant in at least some of the second subset of Nwell regions by implanting a first number of ions with a first energy; and
   implanting a p-type dopant in the at least some of the second subset of Nwell regions by implanting a second number of ions with a second energy.

10. The method of claim 1, wherein the implanting step further comprises:
    implanting a first p-type dopant in both the extrinsic and intrinsic base areas of at least some of the bipolar transistors;
    wherein the method further comprises forming emitters of the bipolar transistors after the step of implanting a first p-type dopant and then implanting a second p-type dopant in the extrinsic base areas of at least some of the bipolar transistors.

11. The method of claim 10, wherein the first p-type dopant and the second p-type dopant comprise boron.

12. A method of fabricating a BiCMOS circuits, comprising the steps of:
    forming a plurality of Pwell regions in a semiconductor substrate;
    forming a plurality of isolation regions to electrically isolate at least some of the Pwell regions;
    forming MOS transistors in a first subset of said plurality of Pwell regions;
    forming extrinsic and intrinsic base regions of bipolar transistors in a second subset of Pwell regions; and
    implanting a n-type dopant in at least some of said second subset of Pwell regions to form lightly doped collector regions in at least some of the bipolar transistors.

* * * * *